United States Patent
Chen et al.

(10) Patent No.: US 8,994,046 B2
(45) Date of Patent: Mar. 31, 2015

(54) LIGHT EMITTING DIODE DEVICE FOR CLAMPING ELECTRICALLY CONDUCTIVE ELEMENT

(75) Inventors: Shang-Lin Chen, Banciao (TW); Chih-Hung Hsu, Tu Chen (TW)

(73) Assignee: Everlight Electronics Co., Ltd., New Taipei (TW)

( * ) Notice: Subject to any disclaimer, the term of this patent is extended or adjusted under 35 U.S.C. 154(b) by 1146 days.

(21) Appl. No.: 12/275,431

(22) Filed: Nov. 21, 2008

(65) Prior Publication Data

US 2009/0134423 A1    May 28, 2009

(30) Foreign Application Priority Data

Nov. 23, 2007   (TW) .............................. 96219870 U

(51) Int. Cl.
*H01L 33/00* (2010.01)
*H01L 33/62* (2010.01)

(52) U.S. Cl.
CPC ....... *H01L 33/62* (2013.01); *H01L 2224/48091* (2013.01); *H01L 2224/48247* (2013.01)
USPC ............... 257/98; 257/99; 257/100; 257/666; 257/676; 438/26; 362/80; 362/238

(58) Field of Classification Search
USPC .............. 257/98–100, 666–676; 362/238, 80; 438/26
See application file for complete search history.

(56) References Cited

U.S. PATENT DOCUMENTS

| | | | |
|---|---|---|---|
| 5,221,641 A * | 6/1993 | Kurita et al. .................... | 438/27 |
| 5,746,497 A * | 5/1998 | Machida ....................... | 362/496 |
| 6,084,252 A * | 7/2000 | Isokawa et al. ................. | 257/98 |
| 6,386,733 B1 * | 5/2002 | Ohkohdo et al. ........ | 362/249.06 |
| 6,521,916 B2 * | 2/2003 | Roberts et al. ................ | 257/100 |
| D572,209 S * | 7/2008 | Tokuda ........................ | D13/180 |
| 7,393,706 B2 * | 7/2008 | Adachi et al. .................. | 438/26 |
| 2004/0252501 A1 * | 12/2004 | Moriyama et al. ............ | 362/238 |

* cited by examiner

*Primary Examiner* — Eugene Lee
*Assistant Examiner* — Fang-Xing Jiang
(74) *Attorney, Agent, or Firm* — Muncy, Geissler, Olds & Lowe, P.C.

(57) ABSTRACT

A light emitting diode (LED) device comprises a first lead frame, a second lead frame, a LED die and at least one bump. The LED die is fixed on and electrically connected to the first lead frame. The second lead frame separated from the first lead frame with a distance is connected to the LED die. The bump disposed on at least one of the first lead frame and the second lead frame to identify a gripping space for allowing an electronic element inserted or gripped therein.

15 Claims, 7 Drawing Sheets

LIGHT EMITTING DIODE DEVICE FOR CLAMPING ELECTRICALLY CONDUCTIVE ELEMENT

RELATED APPLICATIONS

This application claims priority to Taiwan Application Serial Number 96219870, filed Nov. 23, 2007, which is herein incorporated by reference.

FIELD OF THE INVENTION

The present invention relates to a light emitting semiconductor device, and particularly relates to a light emitting semiconductor device with three colors, such as colors red, green and blue (RGB) mixed together.

BACKGROUND OF THE INVENTION

Light emitting diode (LED) devices have low power consumption, generate less heat, operate over long periods of time, are small in size, have high impact tolerance, can operate in high speed are mercury free and have good optical performance. LED devices have been applied as a light source with steady wavelengths to an electronic device.

FIG. 1 illustrates a perspective diagram of a conventional LED device 100. The LED device 100 comprises a LED die 101, a first lead 102 and a second lead 103, wherein the first lead 102 and the second lead 103 are electrically connected to the die 101. Generally, the LED die 101 is adhered on a cup recess 104 of the first lead 102 by a isolation adhesive (not shown) so that the LED die 101 is electrically connected to the first lead 102 and the second lead 103 respectively prior a packaging process.

The first lead 102 and the second lead 103 are used to electrically connect to an external power source or connect to other LED devices. Traditionally, the first lead 102 and the second lead 103 are electrically connected to the external power source or LED devices via conductive wires welded on the first lead 102 or on the second lead 103.

However the welding process requires solder or some other welding materials, and it is hard to control the welding quality. Thus it is difficult to manage the processing schedule and processing efficiency.

SUMMARY OF THE INVENTION

Therefore, it is desirable to provide an improved LED device with simple structure, higher reliability and less manufacturing cost.

In some embodiments of the present invention, a LED device is provided, wherein the LED device comprises a LED die, a first lead frame, a second lead frame, two first bumps and two second bumps. Each of the first lead frame and the second lead frame has a first longitudinal lateral side and two second longitudinal lateral sides. The two second longitudinal lateral sides are arranged oppositely and in parallel with each other. The first longitudinal lateral side is disposed between the two second longitudinal lateral sides and connected with both of the two second longitudinal lateral sides. The two first bumps respectively extend towards a direction that the first longitudinal lateral side of the first lead frame faces in a direction in the second longitudinal lateral side of the first lead frame and along a tangent angle of a longitudinal axis of the first lead frame. The two second bumps respectively extend towards a direction that the first longitudinal lateral side of the second lead frame faces in a direction in the second longitudinal lateral side of the second lead frame and along a tangent angle of a longitudinal axis of the second lead frame. Wherein the LED die is fixed on and electrically connected to the first lead frame. The second lead frame separated from the first lead frame with a distance is also connected to the LED die. The at least one bump that is disposed on at least one of the first lead frame and the second lead frame to identify a gripping space for allowing an electronic element inserted or gripped therein. In some embodiments of the present invention, the LED device comprises two third bumps respectively extending towards in a direction in the second longitudinal lateral side of the first lead frame and along a tangent angle of a longitudinal axis of the first lead frame.

In accordance with the above embodiments, the features of the present invention are to provide a LED device at least one bump formed on at least one lead frame to identify a gripping space in allowing an electronic element inserted or gripped therein.

Hence, the gripped space can be applied to replace the conventional welding process for engaging the electronic element with the LED device without requiring any welding materials; and the bump is formed by the surplus materials that is originally should be removed during the formation of the lead frames. The formation of the bump requires no additional materials. Accordingly, the manufacturing cost of the LED can be decreased.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENTS

The foregoing aspects and many of the attendant advantages of this invention will become more readily appreciated and better understood by reference to the following detailed description of preferred embodiment as a LED device, when taken in conjunction with the accompanying drawings. It should be appreciated that the features and invention concepts may be applied on other light emitting semiconductor device with various light-emitting semiconductor chips, such as ultra high efficiency LED chips or a laser diode chips.

Figure 1:
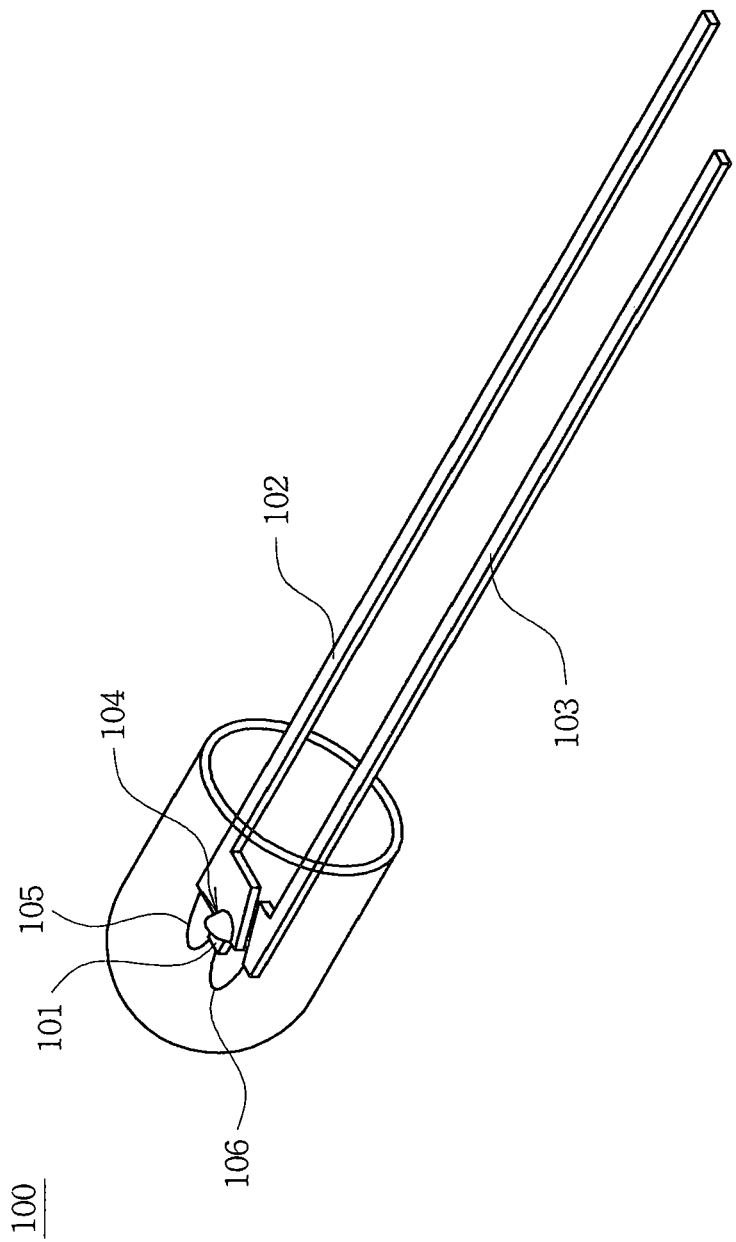
FIG. 1 illustrates a perspective diagram of a conventional LED device 100.
Figure 2A:
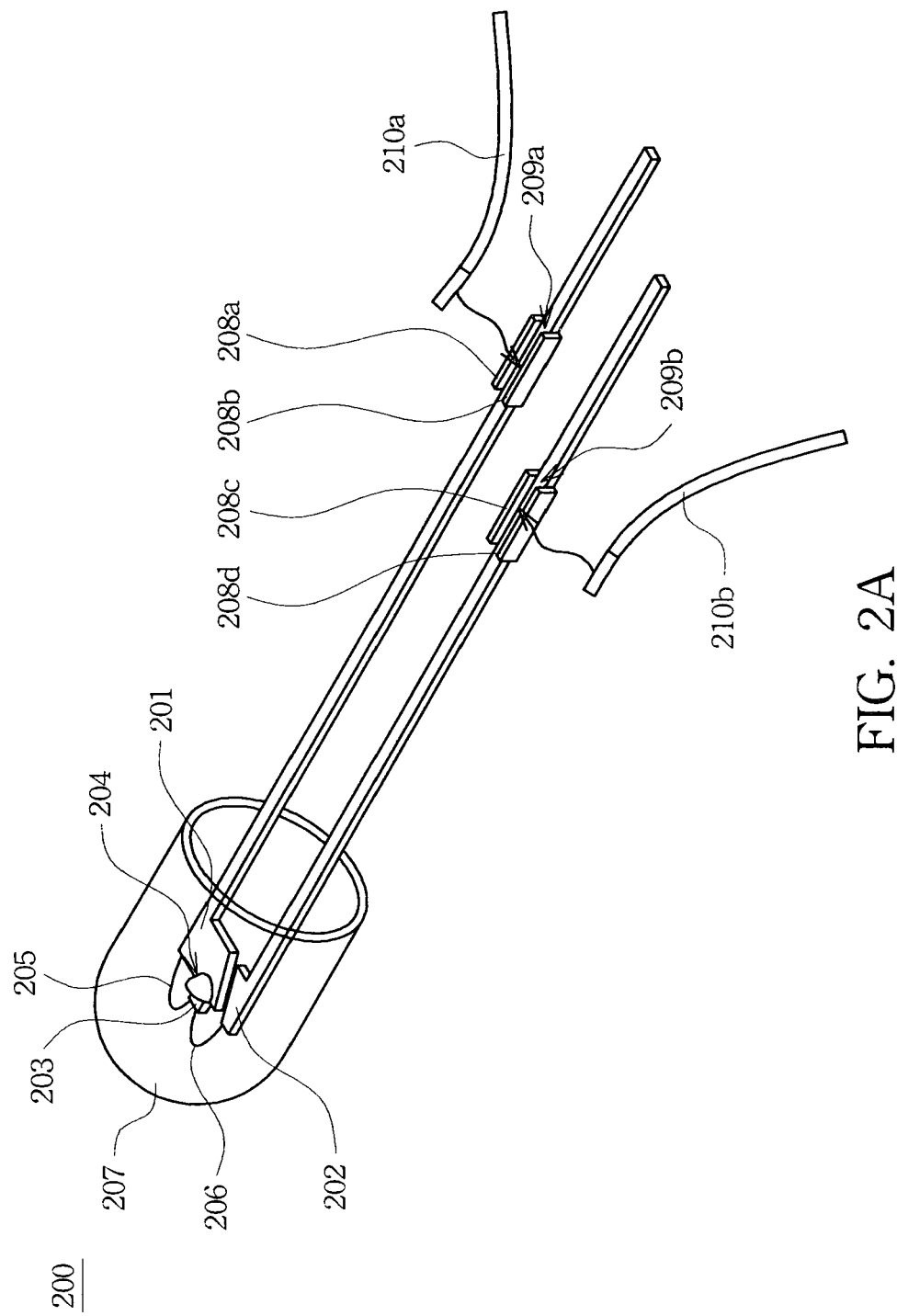
FIG. 2A illustrates a perspective diagram of an LED device 200 in accordance with the first preferred embodiment of the present invention.

FIG. 2A illustrates a perspective diagram of an LED device 200 in accordance with the first preferred embodiment of the present invention. The LED device 200 comprises a LED die 203, a first lead frame 201, a second lead frame 202 and (at least one) a plurality of bumps 208a, 208b, 208c and 208d, wherein the LED die 203 is fixed on and electrically connected to the first lead frame 201. For example, in some embodiments of the present invention, the LED die 203 is fixed on and electrically connected to the first lead frame 201 by a conductive silver paste (not shown). The second lead frame 202 is electrically connected to the LED die 203 via a bonding wire 206. However, in other embodiments of the present invention, the LED die 203 is fixed on the first lead frame 201 by isolation adhesive (not shown), and then is electrically connected to the first lead frame 201 by a bonding wire 205. The second lead frame 202 is electrically connected to the LED die 203 via a bonding wire 206.

The second lead frame 202 that is electrically connected to the LED die 203 separates from the first lead frame 201 with a distance. The bumps 208a, 208b, 208c and 208d are set on at least one of the first lead frame 201 and the second lead frame 202. For example, in some embodiments of the present invention, either the first lead frame 201 or the second lead frame 202 has at least bump 208a, 208b, 208c and 208d set thereon; and in other embodiments of the present invention, both of the first lead frame 201 and the second lead frame 202 has at least one bumps (such as the 208a, 208b, 208c and 208d shown on FIG. 2B) set thereon. Each of the bumps 208a, 208b, 208c and 208d set on the first lead frame 201 or on the second lead frame 202 is used to identify a gripping space 209 with the corresponding first lead frame 201 or with the corresponding second lead frame 202 for allowing an external electrical element, such as an external wire inserted or gripped therein. Each of the bumps 208a, 208b, 208c and 208d is a protrusion extending from the corresponding first lead frame 201 or the corresponding second lead frame 202, wherein the protrusion has a width (referenced as "W") substantially less than 1 mm.

Figure 2B:
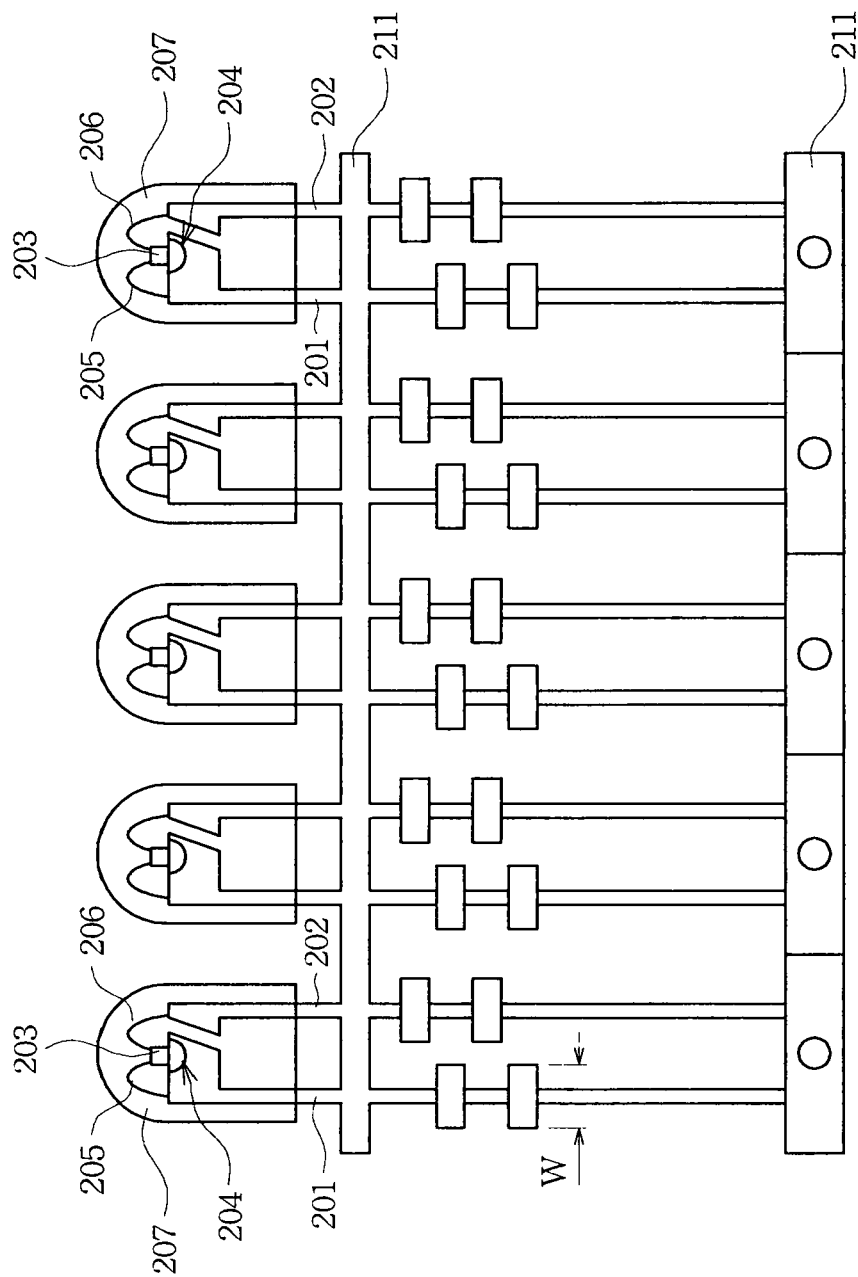
FIG. 2B illustrates a cross-sectional view of an intermediate product of the LED device 200 shown in FIG. 2A.

FIG. 2B illustrates a cross-sectional view of an intermediate product of the LED device 200 shown in FIG. 2A. Hence the LED device 200 is formed in batch; the steps for forming of a plurality of LED devices 200 are started by providing a plural pairs of lead frames cross-linked by a side bar 211. As shown in FIG. 2B, each pair of the lead frames is consisted of a first lead frame 201 and a second lead frame 202 that are separated from each other except the linkage of the side bar 211, wherein each of the first lead frame 201 has a cup recess 204 used to carry a LED die 203.

In some embodiment of the present invention, the LED die 203 is first adhered on a surface of the cup recess 204 by an isolation adhesive (not shown); and then is electrically connected to the first lead frame 201 and the second lead frame 202 respectively via a bonding wire 205 and a bonding wire 206. The electrical contacts of the LED die 203, the first lead frame 201 and the second lead frame 202 are packaged by epoxy (or silicon gel) 207. Subsequently, a trimming process is conducted to cut the side bar 211; and the first lead frame 201 and the second lead frame 202 are also bended at the same process.

In some preferred embodiments of the present invention, the trimming process can be varied in accordance with the consumers' requirement to make the LED devices 200 having different shapes and angles. The bumps 208a, 208b, 208c and 208d are formed by punching the remaining portions of side bar 211 that are left either/both on the first lead frame 201 or/and on the second lead frame 202 after the trimming process. However, in some other embodiments of the present invention, the bumps 208a, 208b, 208c and 208d may be formed by other materials and additional steps; and pivots either/both on the first lead frame 201 or/and on the second lead frame 202.

In the embodiments of the present invention, the bumps can be used to identify a gripping space for allowing an external electronic element, such as a conductive wire 210a or 210b, inserted or gripped therein. For example, the gripping space 209a and 209b that are respectively identified by the bumps 208a, 208b, 208c and 208d and the first lead frame 201 and the second lead frame 202 are shaped as rectangular recesses parallel to the first lead frame 201 and the second lead frame 202. It must be appreciated that, in some other embodiments of the present invention, the bumps may be formed either on the first lead frame 201 or on the second lead frame 202, thus the gripping space may be formed merely on the first lead frame 201 or on the second lead frame 202.

In the present embodiment, the bumps 208a 208b, 208c and 208d respectively serves as the side walls of the rectangular gripping spaces 209a and 209b are bended inward to enforce the rectangular gripping spaces 209a and 209b clamp the conductive wires 210a and 210b more securely. The reliability of the electrical contacts both formed between the first lead frame 201 and the conductive wire 210a and between the second lead frame 202 and the conductive wire 210b are also improved. In addition, in some other embodiments, the bumps 208a 208b, 208c and 208d also can be bended outward to respectively make the first lead frame 201 and the second lead frame 202 secured on other external electronic elements, whereby the applying flexibility of the LED device 200 can be substantially Improved.

It should be appreciated that the types of the gripping space are not limited, the manufacturers can verify the shapes or the sizes of the gripping space in depending on the design of various products or in depending on the characteristics of the materials. The electrical connections formed between the first leas frame 201, the second lead frame 202 and the external electronic elements are also not limited. For example, in the present embodiment, the first lead frame 201, the second lead frame 202, the conductive wire 210a and the conductive wire 210b are form a parallel connection. However, other types of connection can also be formed there between.

Figure 3:
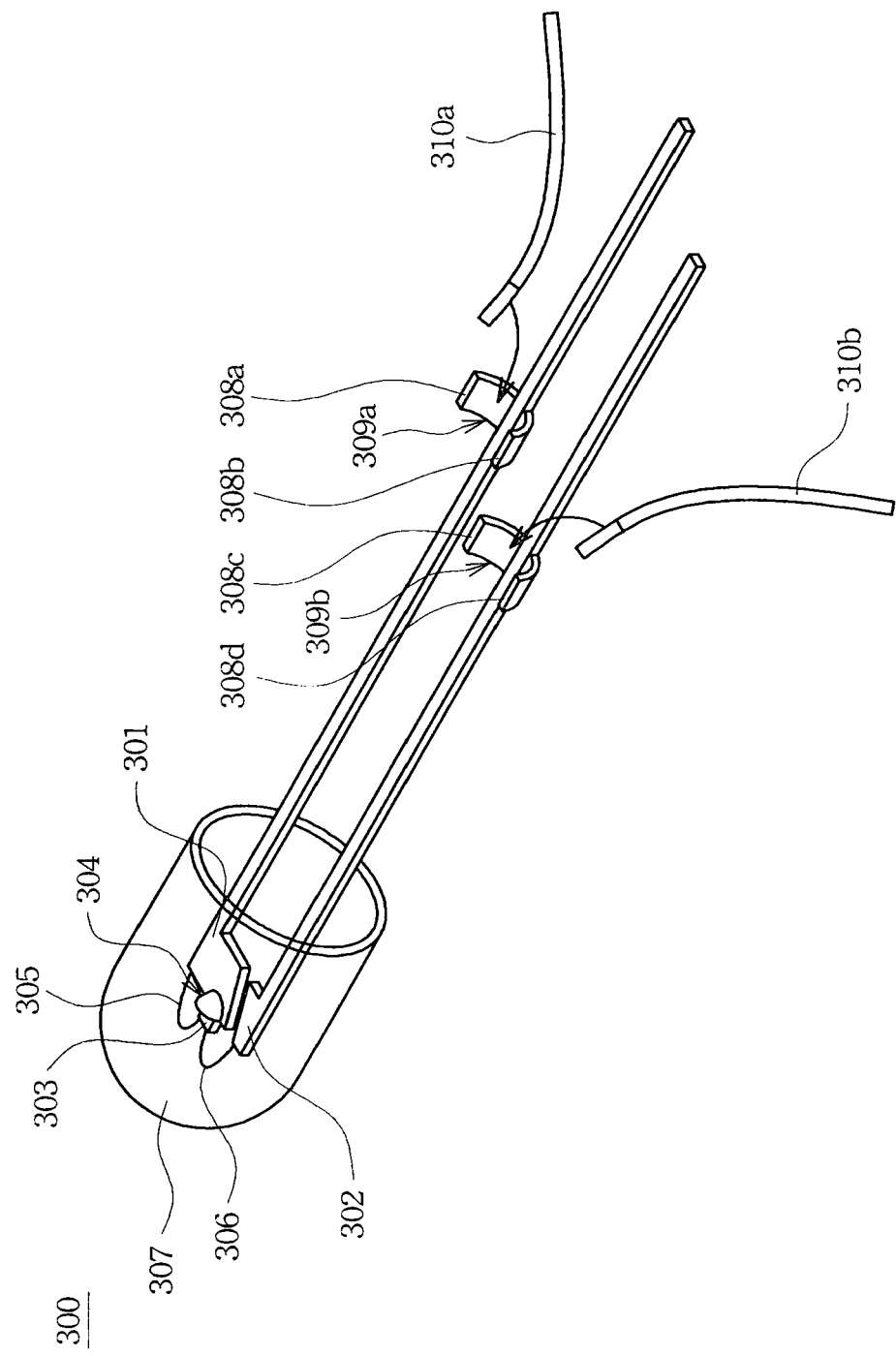
FIG. 3 illustrates a perspective diagram of an LED device 300 in accordance with the second preferred embodiment of the present invention.

FIG. 3 illustrates a perspective diagram of an LED device 300 in accordance with the second preferred embodiment of the present invention. The structure of the LED device 300 is similar to that of the LED device 200, the difference is the shape of the bumps. In the present embodiment, LED device 300 has four arc bumps 308a, 308b, 308c and 308d. However the bumps 208a, 208b, 208c and 208d of the LED device 200 are rectangular. The four arc bumps 308a, 308b, 308c and 308d are used to identify two semi-cylindrical gripping spaces 309a and 309b parallel to the first lead frame 301 and the second lead frame 302 for respectively allowing two external conductive wires 310a and 310b inserted therein. It must be appreciated is that, in some other embodiments of the present invention, the bumps may be formed either on the first lead frame 301 or on the second lead frame 302, thus the semi-cylindrical gripping space may be merely formed on the first lead frame 301 or on the second lead frame 302 to engage with the external electronic element.

Figure 4:
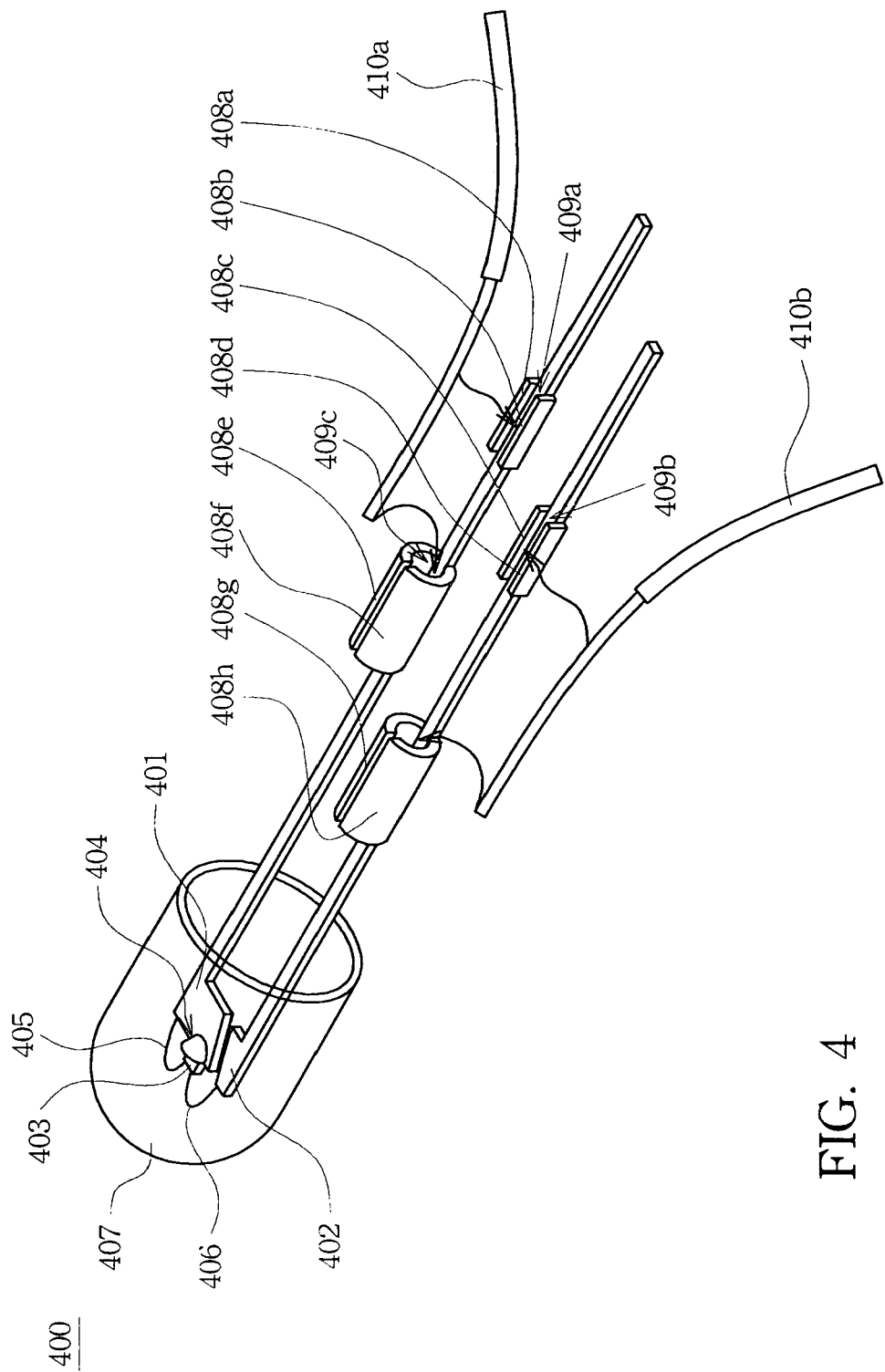
FIG. 4 illustrates a perspective diagram of an LED device 400 in accordance with the third preferred embodiment of the present invention.

FIG. 4 illustrates a perspective diagram of an LED device 400 in accordance with the third preferred embodiment of the present invention. As shown on FIG. 4, the LED device 400 has four rectangular bumps 408a, 408b, 408c and 408d and four arc bumps 408e, 408f, 408g and 408h respectively formed on the first lead frame 401 and the second lead frame 402. Wherein the rectangular arc bumps 408a and 408b and the arc bumps 408e and 408f are respectively identify a rectangular gripping spaces 409a and an semi-cylindrical gripping space 409c on the first lead frame 401 for allowing an external conductive wire 410a inserted therein; and the rectangular bumps 408c and 408d and the arc bumps 408g and 408h are respectively identify a rectangular gripping spaces 409b and an semi-cylindrical gripping space 409d on the second lead frame 402 for allowing an external conductive wire 410b inserted therein. In the present embodiment, the rectangular bumps 408a and 408b and the arc bumps 408e and 408f are also can be bended inward to enforce the corresponding gripping spaces clamp the conductive wires 410a and 410b more securely.

Figure 5A:
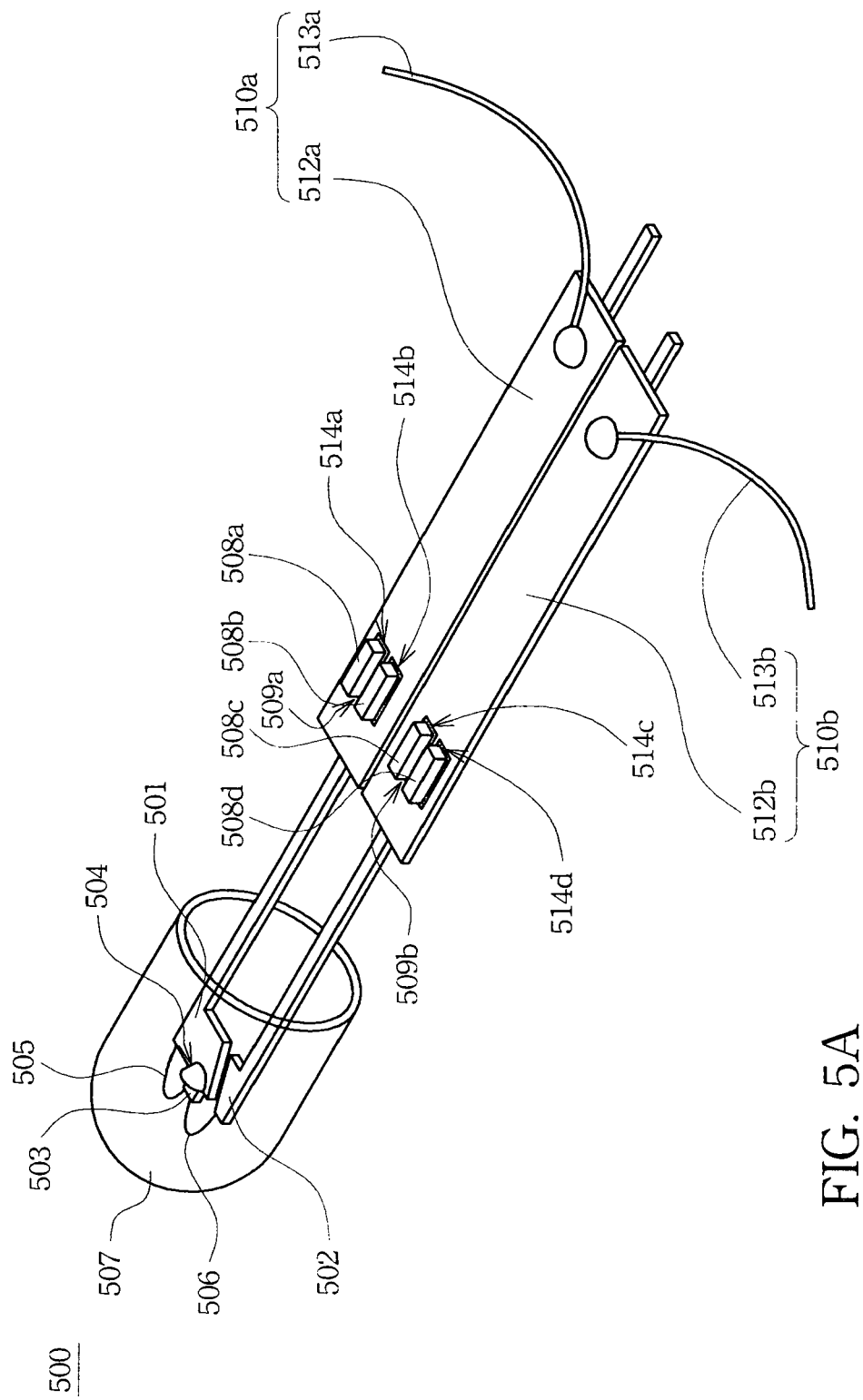
FIG. 5A illustrates a perspective diagram of an LED device 500 in accordance with the fourth preferred embodiment of the present invention.

FIG. 5A illustrates a perspective diagram of an LED device 500 in accordance with the fourth preferred embodiment of the present invention. The structure of the LED device 500 is similar to that of the LED device 200; the difference is the engagement between the bumps and the external electronic elements. In the present embodiment, the external electronic elements are two external conductive wires 510a and 510b respectively engaged with the first lead frame 501 and the second lead frame 502. Each of the two conductive wires 510a and 510b is consisted of a wire portion and an engaging plate electrically connected on the wire portion. For example, the conductive wire 510a is consisted of a wire portion 513a and a metal plate portion 512a electrically connected to the wire portion 513a; and the conductive wire 510b is consisted of a wire portion 513b and a metal plate portion 512b electrically connected to the wire portion 513b. In addition, the metal plate portions 512a and 512b respectively have two through holes in associated with (corresponding to) the bumps 508a, 508b, 508c and 508d to respectively engage the conductive wires 510a and 510b to the first lead frame 501 and the second lead frame 502. In the present embodiment, through holes 514a and 514b formed on the metal plate portion 512a are used to allow the bump 508a and 508b respectively embed therein; and the two through holes 514c and 514d formed on the metal plate portion 512b are used to allow the bump 508c and 508d respectively embed therein. In some other embodiments of the present invention, shape, size and quantity of the through holes formed on the metal plate portion 512a and 512b may be varied in depending on products' design. For example, each of the metal plate portions 512a and 512b may have only one through hole in associated with (corresponding to) one of the bumps 508a, 508b, 508c and 508d to engage the conductive wires 510a or 510b with the first lead frame 501 or the second lead frame 502.

Figure 5B:
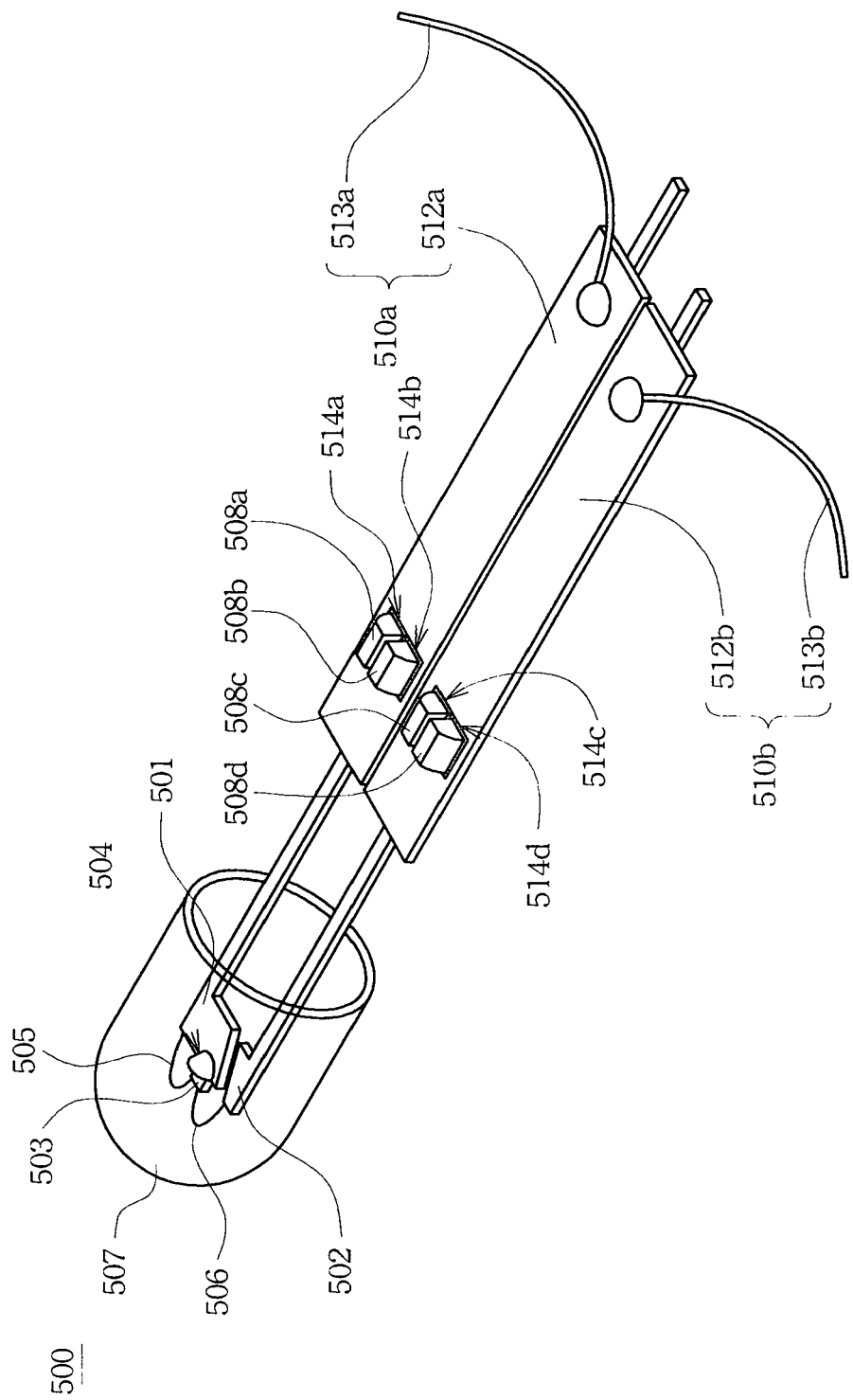
FIG. 5B illustrates a perspective diagram of an LED device 500 after the bumps 508a, 508b, 508c and 508d are bended.

The bumps 508a, 508b, 508c and 508d that are respectively embed in the through hole 514a, 514b, 514c and 514d can be bended to enforce the first lead frame 501 and the second lead frame 502 engage with the conductive wires 510a and 510b more securely. FIG. 5B illustrates a perspective diagram of an LED device 500 after the bumps 508a, 508b, 508c and 508d are bended. In present embodiment, the bumps 508a and 508b formed on the first lead frame and the bumps (such as the bumps 508a and 508b or the bumps 508c and 508d) formed on the first lead frame 501 or on the second lead frame 502 are ended inward to draw the bumps close up. However in some embodiments of the present invention, the bumps also can be bended outward from the gripping space 509a or 509b for clamping the metal plate portion 512a or 512b.

In accordance with the above embodiments, the features of the present invention are to provide a LED device at least one bump formed on a lead frames to identify a gripping space in allowing an electronic element inserted or gripped therein. Hence, the gripped space can be applied to replace the conventional welding process for engaging the electronic element with the LED device without requiring any welding materials; and the bump is formed by the surplus materials that is originally should be removed during the formation of the lead frames. The formation of the bump requires no additional materials. Accordingly, the manufacturing cost of the LED can be decreased.

As is understood by a person skilled in the art, the foregoing preferred embodiments of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure.

What is claimed is:

1. A light emitting diode (LED) device comprising:
   two lead frames separated with each other, each of the two lead frames having a first longitudinal lateral side and two second longitudinal lateral sides arranged oppositely and in parallel with each other, wherein the first longitudinal lateral side is disposed between the two second longitudinal lateral sides and connected with both of the two second longitudinal lateral sides;
   an LED die electrically connected to both of the two lead frames;
   two first bumps respectively having a rectangular shape, respectively disposed on the two second longitudinal lateral sides of one of the two lead frames, and respectively extending towards in a direction in the second longitudinal lateral side and along a tangent angle of a longitudinal axis of the lead frame;
   a first gripping space defined by the first longitudinal lateral side and the two first bumps, and shaped as a rectangular recess;
   two third bumps respectively having an arc shape, respectively disposed on the two second longitudinal lateral sides of the one of the two lead frames, and respectively extending towards in the direction in the second longitudinal lateral side and along the tangent angle of the longitudinal axis of the lead frame; and
   a third gripping space defined by the first longitudinal lateral side and the two third bumps, and shaped as a semi-cylinder.

2. The LED device of claim 1, wherein the LED device is a LED chip or a laser diode chip.

3. The LED device of claim 1, wherein the LED die is fixed on a cup recess of one of the two lead frames.

4. The LED device of claim 3, wherein the LED die is electrically connected to the one lead frame by a first bonding wire, and is electrically connected to the other lead frame by a second bonding wire.

5. The LED device of claim 1, wherein a longitudinal axis of the rectangular recess is in parallel to a longitudinal axis of the first longitudinal lateral side of the one lead frame.

6. The LED device of claim 1, wherein a longitudinal axis of the semi-cylinder is in parallel to a longitudinal axis of the first longitudinal lateral side of the one lead frame.

7. The LED device of claim 1, wherein the two third bumps are bended inward to the third gripping space.

8. The LED device of claim 1 further comprising:
   two second bumps respectively disposed on the two second longitudinal lateral sides of the other lead frame, and respectively extending towards in a direction in the second longitudinal lateral side and along a tangent angle of a longitudinal axis of the other lead frame; and a second gripping space defined by the first longitudinal lateral side of the other lead frame and the two second bumps, for allowing an electronic element inserted or gripped therein.

9. The LED device of claim 8, wherein each of the two second bumps has a rectangular shape; and the second gripping space is shaped as a rectangular recess, and a longitudinal axis of the rectangular recess is in parallel to a longitudinal axis of the first longitudinal lateral side of the other lead frame.

10. The LED device of claim 8, wherein each of the two second bumps has an arc shape; and the second gripping space is shaped as a semi-cylinder, and a longitudinal axis of the semi-cylinder is in parallel to a longitudinal axis of the first longitudinal lateral side of the other lead frame.

11. A light emitting diode (LED) device comprising:
two lead frames separated with each other, each of the two lead frames having a first longitudinal lateral side and two second longitudinal lateral sides arranged oppositely and in parallel with each other, wherein the first longitudinal lateral side is disposed between the two second longitudinal lateral sides and connected with both the two second longitudinal lateral sides;
an LED die electrically connected to both of the two lead frames;
two first bumps respectively having a rectangular shape, respectively disposed on the two second longitudinal lateral sides of one of the two lead frames, and respectively extending towards in a direction in the second longitudinal lateral side and along a tangent angle of a longitudinal axis of the lead frame;
a first gripping space defined by the first longitudinal lateral side and the two first bumps, and shaped as a rectangular recess, wherein a longitudinal axis of the rectangular recess is in parallel to a longitudinal axis of the first longitudinal lateral side of the one lead frame;
two third bumps respectively having an arc shape, respectively disposed on the two second longitudinal lateral sides of the one of the two lead frames, and respectively extending towards in the direction in the second longitudinal lateral side and along the tangent angle of the longitudinal axis of the lead frame;
a third gripping space defined by the first longitudinal lateral side and the two third bumps, and shaped as a semi-cylinder, wherein a longitudinal axis of the semi-cylinder is aligned to the longitudinal axis of the rectangular recess; and
a conductive wire inserted or gripped in both of the first gripping space and the third gripping space.

12. The LED device of claim 11, wherein the LED device is a LED chip or a laser diode chip.

13. The LED device of claim 11, wherein the LED die is fixed on a cup recess of one of the two lead frames.

14. The LED device of claim 13, wherein the LED die is electrically connected to the one lead frame by a first bonding wire and is electrically connected to the other lead frame by a second bonding wire.

15. The LED device of claim 11, wherein the two third bumps are bended inward to the third gripping space to clamp the conductive wire.

* * * * *